United States Patent [19]
Sivaramakrishnan et al.

[11] Patent Number: 6,132,517
[45] Date of Patent: Oct. 17, 2000

[54] MULTIPLE SUBSTRATE PROCESSING APPARATUS FOR ENHANCED THROUGHPUT

[75] Inventors: Visweswaren Sivaramakrishnan; Tirunelveli S. Ravi, both of Santa Clara; Kramadhati V. Ravi, Atherton, all of Calif.

[73] Assignee: Applied Materials, Inc., Santa Clara, Calif.

[21] Appl. No.: 08/804,505

[22] Filed: Feb. 21, 1997

[51] Int. Cl.[7] .................................................. C23C 16/00
[52] U.S. Cl. .................... 118/719; 118/715; 118/725; 118/729; 118/730; 156/345
[58] Field of Search ...................... 118/715, 719, 118/725, 729, 730; 156/345

[56] References Cited

U.S. PATENT DOCUMENTS

| | | |
|---|---|---|
| 4,113,547 | 9/1978 | Katz et al. . |
| 4,951,601 | 8/1990 | Maydan et al. . |
| 5,000,113 | 3/1991 | Wang et al. . |
| 5,001,594 | 3/1991 | Bobbio . |
| 5,037,262 | 8/1991 | Moll et al. . |
| 5,099,571 | 3/1992 | Logan et al. . |
| 5,166,856 | 11/1992 | Liporace et al. . |
| 5,292,554 | 3/1994 | Sinha et al. . |
| 5,315,473 | 5/1994 | Collins et al. . |
| 5,316,645 | 5/1994 | Yamagami et al. . |
| 5,325,261 | 6/1994 | Horwitz . |
| 5,382,803 | 1/1995 | Asakawa . |
| 5,427,620 | 6/1995 | deBoer et al. . |
| 5,431,737 | 7/1995 | Keller et al. . |
| 5,452,510 | 9/1995 | Barnes et al. . |
| 5,460,703 | 10/1995 | Nulman et al. . |
| 5,463,525 | 10/1995 | Barnes et al. . |
| 5,486,975 | 1/1996 | Shamouilian et al. . |
| 5,491,603 | 2/1996 | Birang et al. . |
| 5,518,644 | 5/1996 | Cheung et al. . |
| 5,521,790 | 5/1996 | Ruchel et al. . |
| 5,558,717 | 9/1996 | Zhao et al. . |
| 5,571,366 | 11/1996 | Ishii et al. ............................ 156/345 |
| 5,855,681 | 1/1999 | Maydan et al. ....................... 118/719 |
| 5,946,184 | 8/1999 | Kanno et al. ......................... 361/234 |

*Primary Examiner*—Shrive Beck
*Assistant Examiner*—Norca L. Torres-Velazquez
*Attorney, Agent, or Firm*—Townsend & Townsend & Crew

[57] ABSTRACT

A dual wafer processing apparatus (4) includes a chamber housing (14) defining an interior and having upper, lower and central portions (18, 20, 16). An electrostatic chuck (34) has electrostatic chucking surfaces (38, 40) on opposite sides. The chuck is rotatably mounted within the chamber housing so that the chucking surfaces face the upper and lower portions of the chamber housing. After a wafer (36) is positioned on a chucking surface, electrostatic forces are used to maintain the wafer secured to the chucking surface. The chuck is then rotated 180° to permit placement of a second wafer on the second chucking surface. Processing of the two wafers occurs simultaneously. Electrostatic chucking surfaces could be replaced by mechanical wafer clamps.

36 Claims, 4 Drawing Sheets

MULTIPLE SUBSTRATE PROCESSING APPARATUS FOR ENHANCED THROUGHPUT

BACKGROUND OF THE INVENTION

This invention relates to equipment for processing substrates, and in particular to a method and apparatus for processing two or more substrates at the same time in a single processing chamber without a corresponding increase in the processing chamber footprint.

Numerous techniques and apparatus are well-known for use in the processing of semiconductor wafers to make integrated circuits. State of the art fabrication facilities (known as "fabs") for carrying out such processes are typically large buildings within which "clean rooms" of thousands of square feet of floor area are provided. The clean rooms contain the equipment within which the various semiconductor fabrication processes are carried out, for example, chemical vapor deposition equipment for deposition of conductive or insulative materials on the wafers, ion implantation equipment for introduction of dopants into the wafers, furnaces for heating the wafers, plasma etchers for removing material from the wafers, etc.

Compared with even their recent predecessors, clean rooms today are extraordinarily clean, often having particle densities of less than class 1. Such low particle densities require expensive equipment to purify the air in the clean room, as well as unusual care in all other respects. The result of these measures is that floor space in such clean rooms is expensive. The per-square-foot construction cost, as well as maintenance cost, is high.

A trend in the manufacture of integrated circuits is the use of single wafer processing equipment. In single wafer equipment, processing is carried out on the wafers one wafer at a time. That is, one wafer is introduced from a cassette holding many wafers into the processing chamber. The necessary process on the wafer is carried out in the chamber, then the wafer is removed from the chamber and the next wafer introduced. Typically, such single wafer processing chambers are clustered around a central robot that can load the chambers with individual wafers. The use of single wafer processing provides higher yields by making the process more controllable across the entire wafer, typically 8 inches (20 cm) in diameter at present, and 12 inches (30 cm) in the near future. The higher yields produced by single wafer systems have resulted in their use in many of the advanced fabrication facilities used today in the semiconductor industry.

In such single wafer processing chambers the wafer is maintained on a pedestal or susceptor during the desired operation. An electrostatic chuck is sometimes used to hold the wafer in position. Using electrostatic forces to hold the wafer (or substrate) in place eliminates the need for a clamp ring, which is used in some other systems, to secure the substrate to the chuck.

Two types of electrostatic chucks used in processing chambers are unipolar and bipolar electrostatic chucks. Unipolar electrostatic chucks attract semiconductor wafers, or other substrates, to their dielectric-covered surfaces by the electrostatic attraction of induced charges. An induced charge is created by applying a voltage to the chuck and creating a charged plasma above the wafer as the current ground path. An example of a unipolar electrostatic chuck is shown in U.S. Pat. No. 5,459,632, entitled "Releasing a Workpiece From an Electrostatic Chuck". Bipolar electrostatic chucks do not require plasma to work. They are, however, more complicated to design and manufacture than unipolar chucks. An example of a bipolar electrostatic chuck is shown in U.S. Pat. No. 5,001,594, entitled "Electrostatic Handling Device".

SUMMARY OF THE INVENTION

The present invention is directed to a multiple substrate processing apparatus that increases throughput without a corresponding increase in the footprint of the processing apparatus, and to an improved electrostatic chuck for use in such devices as well as elsewhere.

In one embodiment, the processing apparatus includes a chamber housing defining an interior and having first and second housing portions. An electrostatic chuck, having first and second electrostatic chucking surfaces on different sides, is movably mounted within the chamber housing so that the chucking surfaces face the first and second housing portions. After a wafer or other substrate is positioned on a chucking surface, electrostatic forces are used to maintain the wafer secured to the chucking surface. The chuck is then reoriented to permit placement of a second wafer on the second chucking surface. Processing of the wafers occurs simultaneously. A conventional substrate processing chamber housing can be modified to create a dual substrate chamber having upper and lower material process regions.

The dual substrate processing apparatus embodiment provides significant advantages over conventional single substrate processing apparatus. A dual substrate processing apparatus made according to the invention can increase throughput, for example, by 70% to 90%, without increasing the footprint of the system, that is, the horizontal floor space used by the process chamber. Increasing throughput without increasing floor space makes more efficient use of expensive clean room space. Cost effectiveness is enhanced because no significant modifications to most of the components of the substrate processing system, such as the wafer transfer chamber, robot, wafer cassette, load-lock and gas panels, are required. Common electrical wires, cooling channels and helium flow channels can be used to accommodate both sides of an electrostatic chuck.

Importantly, once a substrate is chucked to an electrostatic chuck, the voltage to the chuck can be turned off while maintaining the wafer in a chucked state. That is, the electrostatic charge holding the wafer to the chuck remains even though the power source to the chuck (and the power source to the induction coils creating the plasma for unipolar electrostatic chucks) has been disconnected. This permits the chuck to be reoriented, typically rotated 180°, to position each chucking surface at a proper orientation to receive a wafer.

The invention preferably uses an electrostatic chuck. However, increased throughput is also achievable using mechanical substrate clamping assemblies.

Other features and advantages of the invention will appear from the following description in which the preferred embodiment has been set forth in detail in conjunction with the accompanying drawings.

DESCRIPTION OF THE PREFERRED EMBODIMENT

Figure 1:
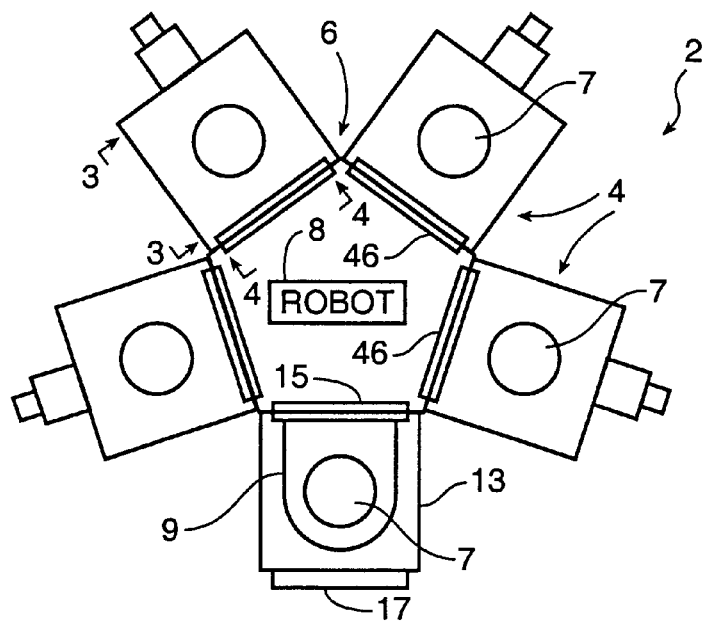
FIG. 1 is a simplified top plan view of a multichamber substrate processing system in which dual substrate processing apparatus made according to the present invention may be incorporated.

FIG. 1 illustrates a multichamber substrate processing system 2 in which four dual substrate processing apparatus 4 are used with a polygonal wafer transfer chamber 6 housing a common substrate manipulating robot 8. Robot 8 operates to move substrates 7, typically semiconductor wafers, to and from the processing chambers and a vertically shiftable wafer cassette 9 housed within a loadlock 13. Loadlock 13 has doors 15, 17 to permit access to wafers 7 by robot 8 through door 15 and to wafer cassette 9 through door 17. Examples of single wafer processing systems are disclosed in U.S. Pat. Nos. 4,951,601 entitled "Multi-chamber Integrated Process System"; and 5,000,113 entitled "Thermal CVD/PECVD Reactor for Use for Thermal Chemical Vapor Deposition of Silicon Dioxide and In-situ Multi-step Planarized Process." An example of a multiple wafer processing system is disclosed in U.S. Patent application Ser. No. 08/644,636, filed Apr. 30, 1996, entitled "Multideck Wafer Processing System."

Figure 2:
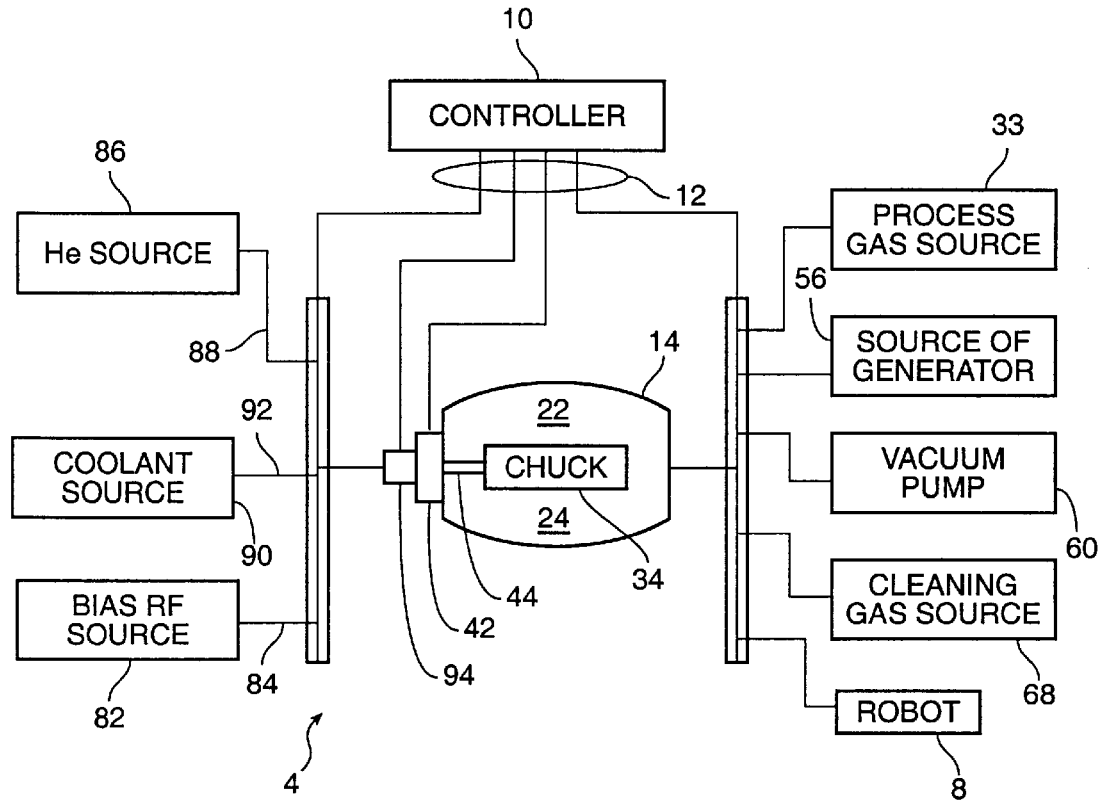
FIG. 2 is a simplified schematic view of the dual substrate processing apparatus of FIG. 1A identifying the various functional components.

FIG. 2 illustrates a dual substrate processing apparatus 4 in conjunction with controller 10, lines 12, and various external sources and elements. As shown in FIG. 2, processing apparatus 4 and robot 8 are controlled by a controller 10, which operates under control of a computer program stored in a computer-readable medium. The computer program dictates the timing, mixture of gases, chamber pressure, temperature, RF power levels, and other parameters of a particular process. Additional details of a typical controller 10 and the computer program are in U.S. Pat. No. 5,661,093, filed Sep. 12, 1996, entitled "Method for the Stabilization of Halogen-doped Films Through the Use of Multiple Sealing Layers", of inventors Kramandhati V. Ravi and Maciek Orczyk. The various processing apparatus 4 and robot 8 are coupled to controller 10 by communication media, for example, conductive lines, a data bus or other means.

Figure 3:
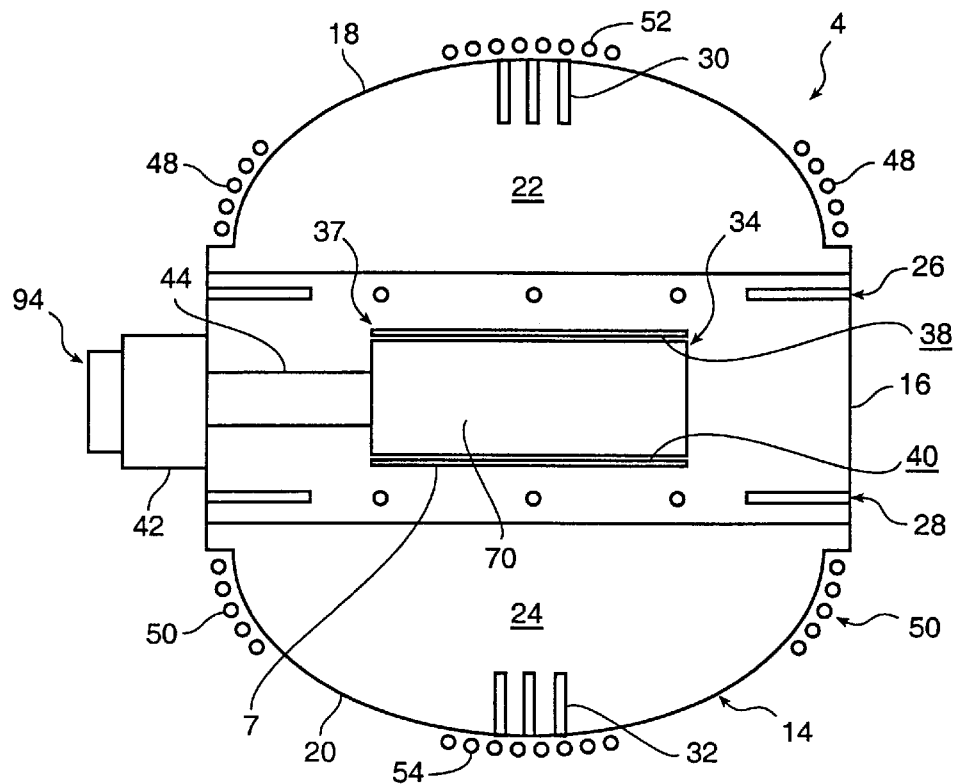
FIG. 3 is a simplified side view of a chamber housing of FIG. 1A containing a dual-sided electrostatic chuck.

Processing apparatus 4, shown in further detail in FIG. 3, comprises a chamber housing 14, including a sidewall 16 and upper and lower domed portions 18, 20 joined by sidewall 16 and defining upper and lower material process regions 22, 24 therein. Portions 18, 20 are dielectric dome structures, typically made of $Al_2O_3$, quartz or AlN, whereas sidewall is made of aluminum. Processing apparatus 4 comprises a number of upper and lower side gas inlets 26, 28 extending inwardly from sidewall 16, and upper and lower central gas inlets 30, 32 extending inwardly from upper and lower domed portions 18, 20. Gas inlets 26–32 are supplied one or more process gases by a process gas source 33 (shown in FIG. 2). Commonly assigned U.S. patent application Ser. No. 08/647,619, filed May 13, 1996, and entitled "Deposition Chamber and Method for Low Dielectric Films", discusses the use and placement of gas inlets 26–32.

As will be discussed in more detail below, process apparatus 4 also comprises a dual-sided electrostatic chuck 34 rotatably mounted within the interior of chamber housing 14 for movement between orientations 180° apart. Chuck 34 supports a pair of substrates 7, one on each of its two chucking surfaces 38, 40. Apparatus 4 also includes a chuck rotator 42, mounted to chamber housing 14, including a support shaft 44 to support chuck 34 within chamber housing 14. Chuck rotator 42 is used to position chuck 34 in either of its two rotary orientations. This permits surfaces 38, 40 to face either upper material process region 22 or lower material process region 24.

Housing 14 also includes RF induction coils 48, 50, 52, 54 positioned about upper and lower domed portions 18, 20 and coupled to one or more source RF generators 56 (see FIG. 2). RF power applied to coils 48, 50, 52, 54 forms a plasma from process gases introduced into upper and lower material process regions 22, 24 through gas inlets 26–32.

Figure 4:
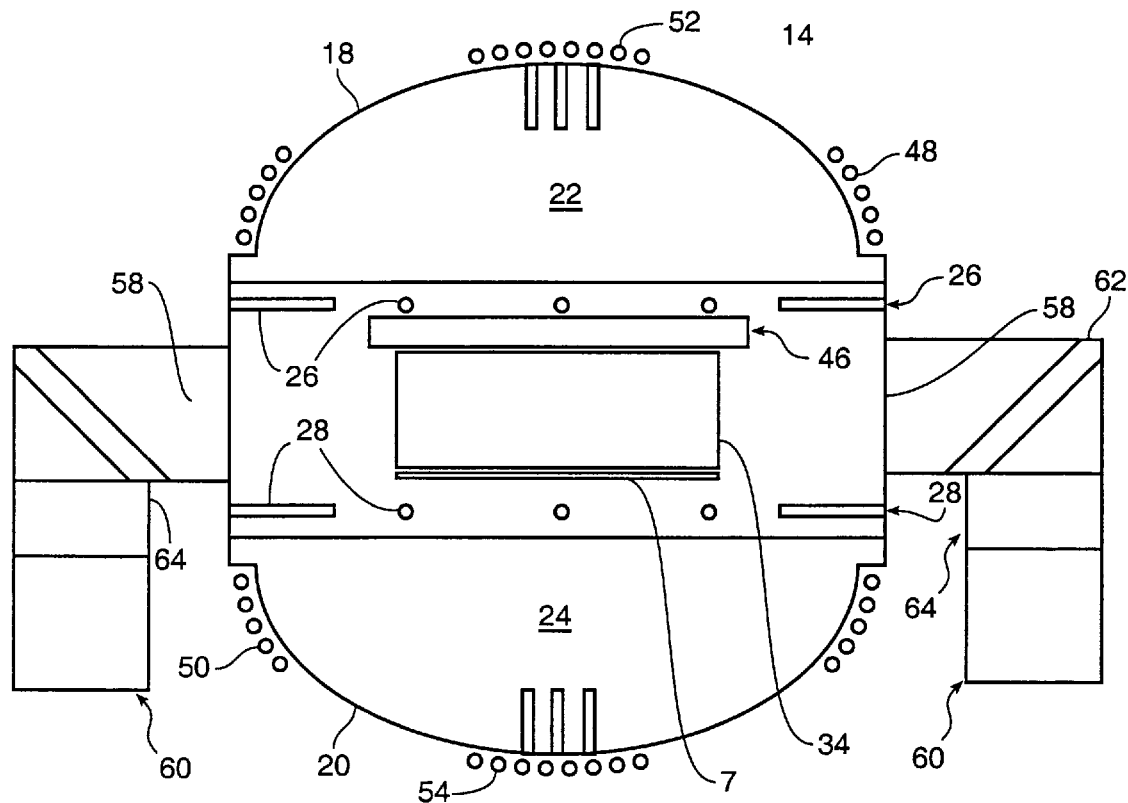
FIG. 4 is a simplified front view of the chamber housing of FIG. 3 illustrating the slit valve and dual turbo pumps associated with each chamber housing.

As shown in FIG. 4, chamber housing 14 includes a slit valve 46 positioned to permit access to the chuck and to any substrate thereon facing upper material process region 22. This permits manipulation by robot 8 in a conventional manner.

Figure 1A:
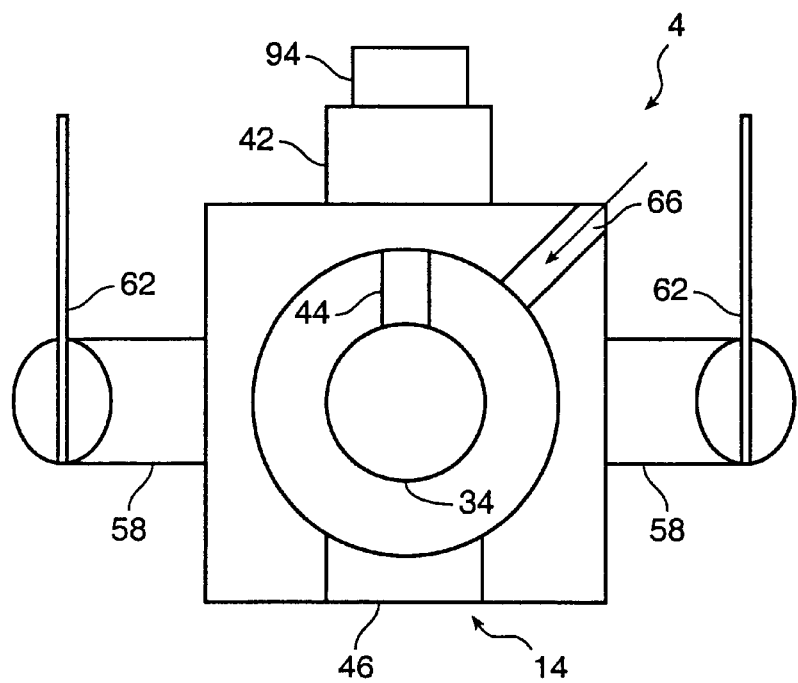
FIG. 1A is a simplified top plan view of a dual substrate processing apparatus with a remote cleaning port that can be used in the multichamber substrate processing system of FIG. 1.

Apparatus 4 also includes a pair of vacuum outlets 58 coupling a pair of turbo pumps 60 to the interior of housing 14 through a pair of gate valves 62 and a pair of throttle valves 64. Use of two sets of vacuum-creating turbo pumps 60 helps to evacuate apparatus 4 quickly for more efficient operation. In addition, as shown in FIG. 1A, process apparatus 4 includes a cleaning port 66. This port can be coupled to a cleaning gas source 68 that remotely generates a cleaning gas, for example, fluorine-containing plasma, which is pumped into the chamber. This is typically done after a desired number of wafer processing cycles to remove deposits from the chamber interior. Alternatively, cleaning gas can be introduced through nozzles 26–32 and other types of cleaning gases can be used.

Figure 5:
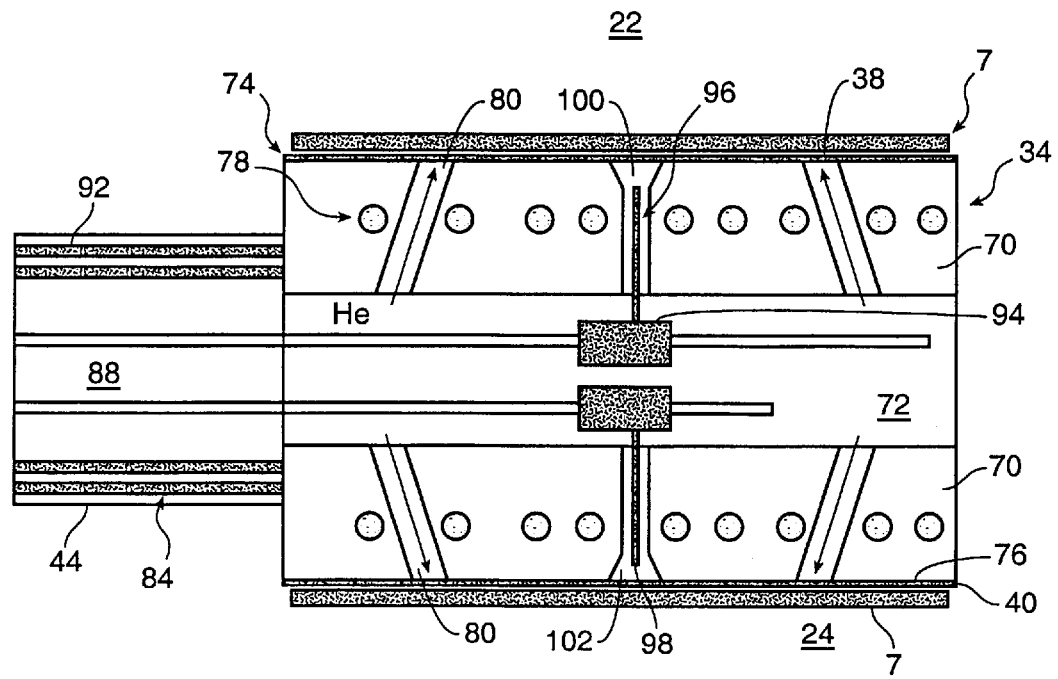
FIG. 5 is an enlarged simplified cross-sectional view of the dual-sided electrostatic chuck of FIG. 3 showing various components.

FIG. 5 illustrates chuck 34 in a simplified cross-sectional view. Chuck 34 includes a chuck body 70 having a central passageway 72 formed therein and aligned with the hollow interior of support shaft 44. Chuck body 70 is generally cylindrical in shape and provides apparatus 4 with two electrostatic chucks. Chucking surfaces 38, 40 are circular in shape and are created by dielectric layers 74, 76, typically made of sprayed $Al_2O_3$ about 5–10 mil thick, covering opposite sides of chuck body 70, which is typically aluminum or ceramic. Chuck body 70 includes water cooling channels 78 and helium channels 80. The helium channels open onto chucking surfaces 38, 40 to assure high heat transfer between wafers 7 and chucking surfaces 38, 40. Chuck body 70 is coupled to a bias RF source 82 (FIG. 2) by an electrical line 84 passing through support shaft 44. Helium is supplied through the interior of support shaft 44 from a helium source 86 (FIG. 2) by a helium line 88. Cooling water is delivered to cooling channels 78 from a coolant source 90 along a coolant line 92 passing through shaft 44.

Apparatus 4 also includes a lift pin actuator 94. Lift pin actuator 94 selectively raises and lowers lift pins 96, 98 housed within bores 100, 102 formed in chuck body 70. Lift pins 96, 98 are moved from a retracted position of FIG. 5 to a raised position to raise the wafer 7 from the associated chucking surface 38, 40, thereby enabling handling of the wafer 7 by the robot. Actuator 94 is a conventional lift pin actuator.

The electrostatic chuck 34 is, in the preferred embodiment, a unipolar chuck. Semiconductor wafer 7 is attracted to and secured to chucking surface 38 by the electrostatic attraction of induced charges created by applying a voltage to chuck body 70 and creating a charged plasma in upper material process region 22; the plasma acts as the current ground path for the unipolar chuck. Using electrostatic forces to hold wafer 7 in place eliminates the need for the clamp ring of a mechanical clamping mechanism, which would otherwise be needed, particularly for the wafer in the lower process chamber. Induced electrostatic forces keep wafer 7 secured to chucking surface 38 even after power is removed from coils 50–54 (FIGS. 3, 4) and electricity to chuck body 70 has been removed by turning off bias RF generator 82. Unless chuck body 70 is prematurely grounded, wafer 7 remains secured to surface 38 for a period of time, for example, two hours, depending on the charge leakage rate from chuck body 70. This permits chuck rotator 42 (FIGS. 2, 3) to reposition first chucking surface 38 so that it faces downwardly and second chucking surface 40 faces upwardly. A second wafer 7 then can be mounted to second chucking surface 40, which now is the upwardly facing chucking surface.

Figure 6:
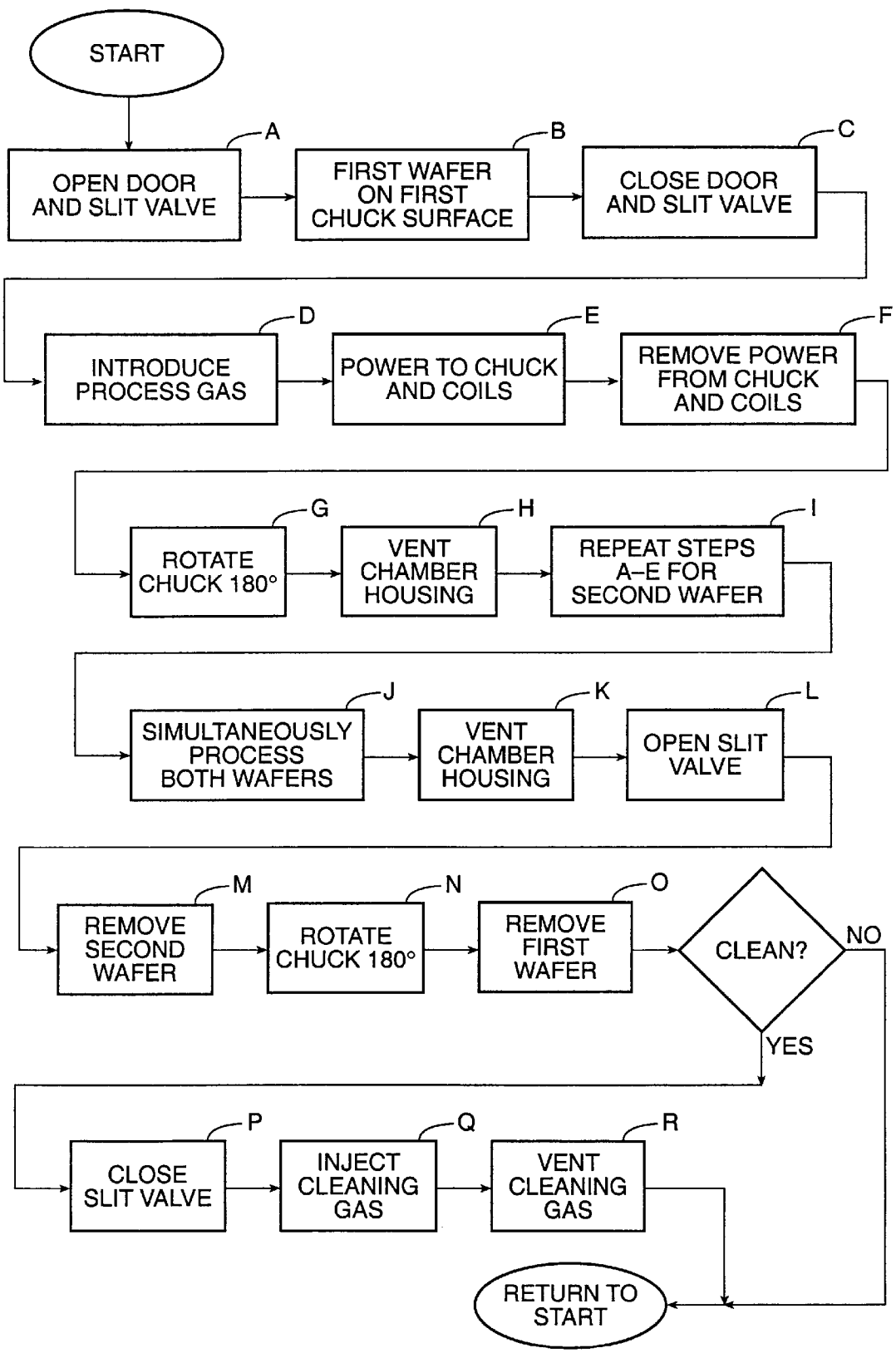
FIG. 6 is a flow chart illustrating the steps involved in operating the system of FIG. 1.

FIG. 6 is a flow chart illustrating the steps involved in the operation of system 2. The steps in FIG. 6 are represented by letters, while the components are referred to by reference numerals. Positioning wafer 7 on surface 38 occurs in the usual manner (step A) by opening door 15 and slit valve 46. Then robot 8 removes a wafer 7 from wafer cassette 9 and positions wafer 7 centrally above chucking surface 38, raising lift pins 96 to raise wafer 7 off of the robot arm, then removing the robot arm through the slit valve and lowering lift pins 96 (step B). Door 15 and slit valve 46 are closed (step C). Gas, including active process gas and/or inert gas, is then introduced through nozzles 26–32 (step D). With a wafer 7 positioned on a surface 38, bias RF generator 82 supplies electricity to chuck body 70 and source RF generator 56 supplies RF energy to induction coils 48, 52 to create the desired plasma in region 22 (step E). Once the desired plasma is created, wafer 7 becomes securely mounted to surface 38 because of the charge induced on the wafer. Power to chuck body 70 is removed and RF energy to coils 48, 50 is removed to extinguish the plasma (step F). Chuck rotator 42 is actuated to rotate chuck 34 180° to reverse the orientation of chucking surfaces 38, 40 (step G). The process gas is then removed from housing 14 (step H). With chucking surface 40 now facing upper region 22, the above process for positioning a wafer 7 is repeated (step I).

Wafers 7 mounted to both chucking surfaces 38, 40 are processed simultaneously (step J). Process gas is then removed from chamber housing 14 (step K) and slit valve 46 is opened (step L). Due to the residual induced charge, wafers 7 remain secured to surfaces 38, 40 even though power to chuck body 70 and induction coils 48–54 has been removed. The uppermost wafer 7 is then contacted by lift pins 100, which causes the wafer to be grounded thus permitting the lift pins to easily raise wafer 7 above chucking surface 40. This permits the robot arm from robot 8 to be inserted beneath the raised wafer. Pins 100 are then retracted, thus permitting wafer 7 to drop down onto and rest on the robot arm. Wafer 7 is then removed through slit valve 46 by the robot arm and returned to wafer cassette 9 or placed in a different chamber housing 14 (step M). Chuck rotator 42 is then operated to rotate chuck 34 180°, thus repositioning first chucking surface 38 to be upwardly facing (step N). The above-described process step M is repeated to remove wafer 7, resting on surface 38, from housing 14 (step O). After both wafers 7 are removed, a decision is made whether to clean chamber housing 14. If the answer is no, return to process step A. If the answer is yes, slit valve 46 is closed (step P) and cleaning gas from source 68 is directed into the interior of chamber housing 14 through port 66 (step Q). After cleaning has been accomplished, the interior of housing 14 is then evacuated by turbo pumps 60 (step R) to permit the processing of wafers 7 to continue by returning to process step A.

This invention recognizes that once wafer 7 has been chucked, both the voltage to the chuck and the power to the induction coils can be turned off while maintaining the wafer in a chucked state. That is, electrostatic charges holding the wafer to the chuck remain even though the power to the chuck and to the induction coils has been disconnected. This permits the chuck to be rotated 180° to align a second chucking surface with the slit valve. Since two wafers can be processed at the same time, throughput is expected to be increased dramatically, for example, 70% to 90%, compared with single wafer chambers. This is achieved without any significant modifications to most of the peripheral components of conventional systems, such as wafer transfer chamber 6, robot 8, or gas sources 33, 68. The footprint of apparatus 4 is essentially the same as with conventional single wafer CVD chambers. Although two sets of gas inlets and induction coils are used, they can be coupled to the same sources 33, 56. Common lines from bias RF generator 82, coolant source 90 and helium source 86 can be used for both sides of the chuck. Some extra complexity is created because of the need for chuck rotator 42 and two sets of separately actuated lift pins 96, 98.

The invention has been described with reference to a dual-sided electrostatic chuck. This same concept could be used with a chuck having more than two sides; however, this could increase the system footprint. Also, because dual-sided electrostatic chuck 34 has its chucking surfaces 38, 40 on opposite sides of the chuck, it is expected that two material process regions 22, 24 will not affect one another during use, as could occur when the chucking surfaces are not oriented 180° apart.

It is possible to practice the present invention using a bipolar chuck, as opposed to the unipolar chuck described above. An advantage of using a bipolar chuck is that a plasma does not have to be struck to create the electrostatic chucking force to secure the wafer to the chucking surface. Instead, energizing the bipolar chuck creates the electric field and an induced charge in wafer 7. The electricity to the chuck can be left on or turned off while flipping the chuck 180° and positioning the second wafer 7 to the opposite chucking surface. Both of these attributes of bipolar chucks improve the speed of the process. It is noted that with bipolar chucks both sides of the chuck need to be electrically isolated and separately powered.

With the present invention an increase in throughput of about 1.7 times is expected to be achieved with an increase in the cost of about 1.3 times. The advantages of the invention are achievable using many existing components of existing single-wafer systems without increasing the footprint of the chamber.

The invention has been described with reference to an HDP-CVD chamber designed for processing semiconductor substrates. This invention is also applicable, however, to other types of chambers designed for processing semiconductor wafers or other types of substrates. For example, the invention could be used with subatmospheric chemical vapor deposition (SACVD) chambers, plasma-enhanced chemical vapor deposition (PECVD) chambers, other CVD chambers and etching chambers as well. Substrates other than semiconductor wafers that may be suitable for use, could include metal and glass.

Each of the applications mentioned above is assigned to Applied Materials, Inc.; the disclosure of each patent and application is incorporated by reference.

Other modification and variation can be made to the disclosed embodiment without departing from the subject of the invention as defined in the following claims. For example, the invention is not limited to the use of electrostatic chucks. Chuck assemblies using mechanical clamping mechanisms can also be used and still provide increased throughput. For example, mechanical clamps could extend towards the chuck body from the upper and lower regions of the chamber housing or the clamps could be mounted to the chuck body. The chuck body and mechanical clamps could be made so that the chuck body moves vertically or rotates to accommodate the robot arm extending through a single slit valve. In some situations it may be desirable to keep the chuck body stationary within the chamber housing. To accommodate this design two slit valves could be used and the robot arm could be moved vertically to be aligned with the slit valves. Alternatively, the entire process housing could be moved vertically so the slit valves become aligned with the robot arm.

What is claimed is:

1. A multiple substrate processing apparatus comprising:
    a chamber housing defining an interior, the chamber housing comprising first and second housing portions;
    a chuck assembly comprising a chuck having first and second chucking surfaces and means for securing the substrates to the chucking surfaces;
    the chamber housing comprising a substrate access element providing access to said chamber housing interior to permit substrates to be introduced into and removed from the chamber housing interior; and
    said first and second housing portions comprising first and second material process regions configured to simultaneously process substrates that have been secured to the first and second chucking surfaces, said first and second housing portions being upper and lower housing portions and said first and second material process regions being upper and lower material process regions, wherein said chuck is mounted within said chamber housing for movement between a first orientation, with said first chucking surface facing said first housing portion, and a second orientation with said second chucking surface facing said first housin portion.

2. The apparatus according to claim 1 wherein said first and second chucking surfaces are electrostatic chucking surfaces and said substrates securing means comprises electrostatic securing means.

3. The apparatus according to claim 1 wherein the chuck assembly comprise a substrate lift assembly, the substrate lift assembly comprising a substrate lifting element engageable with a substrate.

4. The apparatus according to claim 3 wherein said substrate lift assembly comprises a plurality of lift pins passable through the first and second chucking surfaces.

5. The apparatus according to claim 1 wherein the apparatus housing is a deposition chamber housing.

6. The chamber according to claim 5 wherein the first and second material process regions comprise first and second HDP-CVD deposition regions.

7. The apparatus according to claim 1 wherein the first and second portions of the chamber housing comprise first and second dielectric domes and said chamber housing comprises a central portion joining the first and second dielectric domes.

8. The apparatus according to claim 1 wherein the chuck is mounted for 180° rotation about an axis between said first and second housing portions.

9. The apparatus according to claim 1 wherein said chuck is a unipolar electrostatic chuck.

10. The apparatus according to claim 1 wherein the substrate access element comprises a slit valve.

11. The apparatus according to claim 1 wherein said first and second chucking surfaces are dielectric surfaces.

12. A multiple substrate processing apparatus comprising:
    a chamber housing defining an interior, the chamber housing comprising first and second housing portions;
    a chuck assembly comprising an electrostatic chuck having first and second electrostatic chucking surfaces adapted to electrostatically secure substrates thereto, said chuck mounted within said chamber housing for movement between a first orientation, with said first chucking surface facing said first housing portion, and a second orientation, with said second chucking surface facing said first housing portion;
    the chamber housing comprising a substrate access element providing access to said chamber housing interior to permit substrates to be introduced into and removed from the chamber housing interior; and
    said first and second housing portions comprising first and second material process regions configured to simultaneously process substrates that have been electrostatically secured to the first and second chucking surfaces.

13. A dual wafer CVD processing apparatus comprising:
    a chamber housing defining an interior, the chamber housing comprising upper and lower housing portions;
    a chuck assembly comprising a unipolar electrostatic chuck having first and second electrostatic chucking surfaces adapted to electrostatically secure wafers thereto, said chuck mounted within said chamber housing for rotation between a first orientation, with said first chucking surface facing said upper housing portion, and a second orientation, with said second chucking surface facing said upper housing portion;
    the chuck assembly comprising a wafer lift assembly, the wafer lift assembly comprising wafer lifting pins passable through said first and second chucking surfaces to be engageable with a wafer on or above a chosen one of said first and second chucking surfaces;
    the chamber housing comprising a slit valve providing access to said chamber housing interior to permit wafers to be introduced into and removed from the chamber housing interior; and
    said upper and lower housing portions comprising dielectric domes partially defining upper and lower CVD process regions configured to simultaneously process wafers that have been electrostatically secured to the first and second chucking surfaces.

14. A dual substrate electrostatic chuck assembly, for use in a substrate processing chamber, comprising:
    an electrostatic chuck having first and second electrostatic chucking surfaces on different sides thereof;
    a substrate lift assembly comprising a substrate lift element engageable with a substrate located adiacent to either of said chucking surfaces; and
    a chuck rotator for positioning the chuck at different angular orientations.

15. A dual substrate electrostatic chuck assembly, for use in a substrate processing chamber, comprising:
    an electrostatic chuck having first and second electrostatic chucking surfaces on different sides thereof; and a substrate lift assembly comprising a substrate lift element engageable with a substrate located adjacent to either of said chucking surfaces, wherein said different sides are opposite sides of said chuck.

16. The assembly according to claim 15 further comprising a chuck rotator coupled to the chuck to position the chuck in first and second rotary orientations oriented about 180° from one another with said chucking surfaces substantially horizontal at both of said rotary orientations.

17. A multiple substrate processing apparatus comprising:
a chamber housing defining an interior, the chamber housing comprising first and second housing portions;
a chuck assembly comprising a chuck having first and second chucking surfaces and means for securing the substrates to the chucking surfaces, said chuck being mounted within said chamber housing for movement between a first orientation, with said first chucking surface facing said first housing portion, and a second orientation, with said second chucking surface facing said first housing portion;
the chamber housing comprising a substrate access element providing access to said chamber housing interior to permit substrates to be introduced into and removed from the chamber housing interior; and
said first and second housing portions comprising first and second material process regions configured to simultaneously process substrates that have been secured to the first and second chucking surfaces.

18. The apparatus according to claim 17 wherein said first and second chucking surfaces are electrostatic chucking surfaces and said substrates securing means comprises electrostatic securing means.

19. The apparatus according to claim 17 wherein said first and second housing portions are upper and lower housing portions and said first and second material process regions are upper and lower material process regions.

20. The apparatus according to claim 17 wherein the chuck assembly comprise a substrate lift assembly, the substrate lift assembly comprising a substrate lifting element engageable with a substrate.

21. The apparatus according to claim 20 wherein said substrate lift assembly comprises a plurality of lift pins passable through the first and second chucking surfaces.

22. The apparatus according to claim 17 wherein the apparatus housing is a deposition chamber housing.

23. The chamber according to claim 22 wherein the first and second material process regions comprise first and second HDP-CVD deposition regions.

24. The apparatus according to claim 17 wherein the first and second portions of the chamber housing comprise first and second dielectric domes and said chamber housing comprises a central portion joining the first and second dielectric domes.

25. The apparatus according to claim 17 wherein the chuck is mounted for 180° rotation about an axis between said first and second housing portions.

26. The apparatus according to claim 17 wherein said chuck is a unipolar electrostatic chuck.

27. The apparatus according to claim 17 wherein the substrate access element comprises a slit valve.

28. The apparatus according to claim 17 wherein said first and second chucking surfaces are dielectric surfaces.

29. A multiple substrate processing apparatus comprising:
a chamber housing defining an interior, the chamber housing comprising first and second housing portions;
a chuck assembly comprising a chuck having first and second chucking surfaces and means for securing the substrates to the chucking surfaces, said chuck being mounted for 180° rotation about an axis between said first and second housing portions;
the chamber housing comprising a substrate access element providing access to said chamber housing interior to permit substrates to be introduced into and removed from the chamber housing interior; and
said first and second housing portions comprising first and second material process regions configured to simultaneously process substrates that have been secured to the first and second chucking surfaces.

30. The apparatus according to claim 29 wherein said first and second chucking surfaces are electrostatic chucking surfaces and said substrates securing means comprises electrostatic securing means.

31. The apparatus according to claim 29 wherein the chuck assembly comprise a substrate lift assembly, the substrate lift assembly comprising a substrate lifting element engageable with a substrate.

32. The apparatus according to claim 31 wherein said substrate lift assembly comprises a plurality of lift pins passable through the first and second chucking surfaces.

33. The apparatus according to claim 29 wherein the apparatus housing is a deposition chamber housing.

34. The apparatus according to claim 29 wherein the first and second portions of the chamber housing comprise first and second dielectric domes and said chamber housing comprises a central portion joining the first and second dielectric domes.

35. The apparatus according to claim 29 wherein the substrate access element comprises a slit valve.

36. The apparatus according to claim 29 wherein said first and second chucking surfaces are dielectric surfaces.

* * * * *